(12) United States Patent
Schweizer et al.

(10) Patent No.: US 8,600,136 B2
(45) Date of Patent: Dec. 3, 2013

(54) METHOD FOR GENERATION OF ATTENUATION MAP IN PET-MR

(75) Inventors: Bernd Schweizer, Herzogenrath (DE); Andre Frank Salomon, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 223 days.

(21) Appl. No.: 13/062,224

(22) PCT Filed: Sep. 9, 2009

(86) PCT No.: PCT/IB2009/053946
§ 371 (c)(1),
(2), (4) Date: Mar. 4, 2011

(87) PCT Pub. No.: WO2010/032168
PCT Pub. Date: Mar. 25, 2010

(65) Prior Publication Data
US 2011/0158497 A1  Jun. 30, 2011

Related U.S. Application Data

(60) Provisional application No. 61/098,254, filed on Sep. 19, 2008.

(51) Int. Cl.
*G06K 9/00* (2006.01)

(52) U.S. Cl.
USPC ...................................................... 382/131

(58) Field of Classification Search
USPC ............... 382/128, 131; 250/363.03, 363.04, 250/370.08, 370.09; 600/410, 411, 436; 378/4, 6, 8, 21, 23
See application file for complete search history.

(56) References Cited

U.S. PATENT DOCUMENTS

| | | | | |
|---|---|---|---|---|
| 5,376,795 | A * | 12/1994 | Hasegawa et al. | 250/363.04 |
| 5,672,877 | A * | 9/1997 | Liebig et al. | 250/363.04 |
| 6,310,968 | B1 | 10/2001 | Hawkins et al. | |
| 6,384,416 | B1 | 5/2002 | Turkington et al. | |
| 8,180,128 | B2 * | 5/2012 | Feiweier et al. | 382/128 |
| 2004/0161140 | A1 * | 8/2004 | Yuzefovich et al. | 382/131 |
| 2005/0226527 | A1 * | 10/2005 | Weese et al. | 382/275 |

(Continued)

FOREIGN PATENT DOCUMENTS

WO   2008064319 A2   5/2008

OTHER PUBLICATIONS

Kops, E. R., et al.; Alternative methods for attenuation correction for PET images in MR-PET scanners; 2007; Nuclear Science Symposium Conference Record; vol. 6: abstract.
Nuyts, J., et al.; Simultaneous Maximum A Posteriori Reconstruction of Attenuation and Activity Distributions from Emission Sinograms; 1999; IEEE Trans. on Medical Imaging; 18(5)393-403.

(Continued)

*Primary Examiner* — Shervin Nakhjavan

(57) ABSTRACT

A magnetic resonance (MR) image segmentation processor (32) is configured to identify one or more geometrical regions of a subject using an MR image of the subject. An emission data reconstruction processor (40) is configured to generate an attenuation map (54) of the subject by assigning initial attenuation values (52) to the geometrical regions of the subject, and to: (i) process (56) emission data acquired from the subject to generate an emission image (58) of the subject, the processing employing the attenuation map of the subject; (ii) update (60) the attenuation map based on corrections calculated using the emission image of the subject; and (iii) iterate operations (i) and (ii) to iteratively generate a reconstructed emission image of the subject.

23 Claims, 2 Drawing Sheets

(56) References Cited

U.S. PATENT DOCUMENTS

Figure 1:
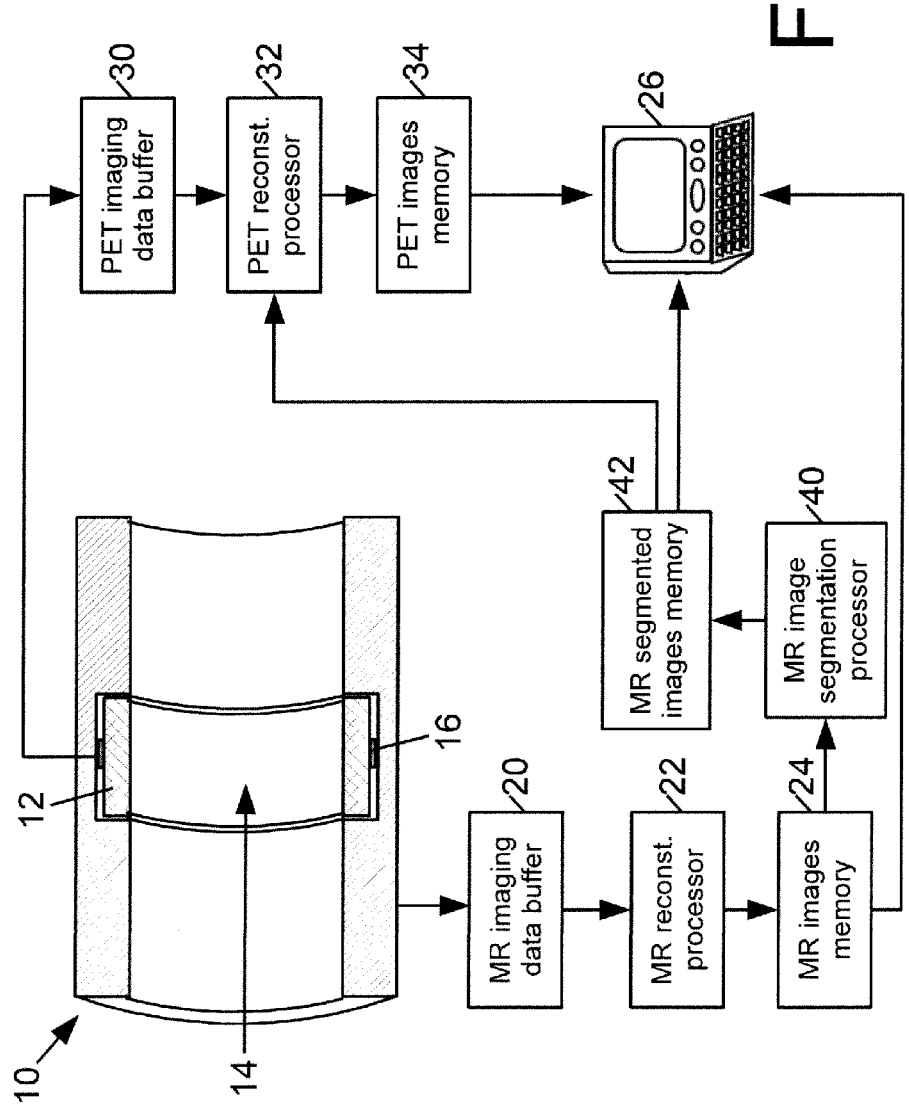

| | | | |
|---|---|---|---|
| 2006/0004274 A1* | 1/2006 | Hawman | 600/407 |
| 2006/0237652 A1* | 10/2006 | Kimchy et al. | 250/363.02 |
| 2007/0106154 A1* | 5/2007 | Conti | 600/436 |
| 2007/0131858 A1 | 6/2007 | Wollenweber et al. | |
| 2008/0135769 A1* | 6/2008 | Rosen | 250/363.09 |
| 2009/0110256 A1* | 4/2009 | Thielemans et al. | 382/131 |
| 2009/0326362 A1* | 12/2009 | Carlse et al. | 600/411 |

OTHER PUBLICATIONS

Zaidi, H., et al.; Determination of the Attenuation Map in Emission Tomography; 2003; J. Nucl. Med.; 44:291-315.

Zaidi, H., et al.; Magnetic resonance imaging-guided attentuation and scatter corrections in three-dimensional brain positron emission tomography; 2003; Med. Phys.; 30(5)937-948.

\* cited by examiner

METHOD FOR GENERATION OF ATTENUATION MAP IN PET-MR

CROSS-REFERENCE TO RELATED APPLICATIONS

This application claims the benefit of U.S. provisional application Ser. No. 61/098,254 filed Sep. 19, 2008, which is incorporated herein by reference.

The following relates to the imaging arts, emission tomography arts, positron emission tomography (PET) arts, single photon emission computed tomography (SPECT) arts, magnetic resonance arts, and related arts. It is described with particular reference to PET/MR systems and synergistic PET/MR imaging applications, but will find application in PET imaging, SPECT imaging, and other radiation emission-based imaging modalities, and in reconstruction techniques for same.

Imaging by emission tomography, such as PET or SPECT, is enhanced by accounting for absorption in the imaged subject using a suitable attenuation map. Emission tomography performed in combination with transmissive computed tomography (CT) advantageously benefits from the availability of radiation attenuation data provided by the CT modality. A reconstructed CT image is essentially an attenuation map of the imaged subject for the x-ray radiation used in generating the CT image data. Although the x-ray radiation used in CT is generally not identical with the 511 keV radiation measured in PET or the emissions measured in SPECT or other emission tomography techniques, it is known that an attenuation map for the emission tomography can be generated from the reconstructed transmission CT image by suitably scaling the CT grayscale levels to account for the differences in radiation type.

There is also interest in performing emission tomography in synergistic combination with magnetic resonance (MR) imaging. Here, one does not have the transmission CT image from which to generate an attenuation map. Attempts to use an MR image as an attenuation map for analyzing PET or SPECT data have been unsuccessful. This is because the contrast mechanism in MR is fundamentally different from that of PET or SPECT (or CT, for that matter). As a consequence, it cannot be said that a "dark" MR pixel necessarily corresponds to either high or low attenuation. For example, bone tissue and air have similar grayscale intensities for some MR imaging modes, but the attenuation of emission radiation by bone is much higher than the attenuation of air.

In such circumstances, it has been contemplated to generate an attenuation map using various techniques. In one contemplated approach, an attenuation "atlas" of a typical subject, for example of a typical human subject, is employed. The attenuation atlas identifies attenuation of various components or regions of the typical subject. However, actual subjects, such as actual human subjects, vary substantially, and it is not straightforward to adapt the attenuation atlas to a particular subject.

Another contemplated approach employs machine learning of typical attenuation patterns to construct a transform algorithm for transforming an MR image into an attenuation map suitable for use in PET. This approach is difficult to implement, and the empirical nature of the machine learning approach can lead to errors that are difficult to predict or estimate.

Another approach has been to incorporate generation of the attenuation map with reconstruction of the emission data. See, for example, Hawkins et al., U.S. Pat. No. 6,310,968 and Nuyts et al., "Simultaneous Maximum A Posteriori Reconstruction of Attenuation and Activity Distributions from Emission Sinograms", IEEE Trans. on Medical Imaging vol. 18 no. 5 pp. 393-403 (1999). These approaches advantageously does not require use of an externally supplied attenuation map. However, they also do not make use of information available from corresponding MR images. Artifacts are sometimes observed in images reconstructed using these single-modality techniques.

The following provides a new and improved apparatuses and methods which overcome the above-referenced problems and others.

In accordance with one disclosed aspect, a method operating in conjunction with a magnetic resonance (MR) image of a subject and emission data acquired from the subject is disclosed, the method comprising: identifying one or more geometrical regions of the subject using the MR image; and iteratively reconstructing the emission data to generate an emission image of the subject utilizing an attenuation map defined by the geometrical regions with attenuation values for the geometrical regions approximated based on the iterative reconstruction.

In accordance with another disclosed aspect, an emission data reconstruction processor is disclosed which is configured to perform the method of the immediately preceding paragraph.

In accordance with another disclosed aspect, an apparatus is disclosed, comprising a reconstruction processor configured to identify one or more geometrical regions of a subject using an MR image of the subject, generate an attenuation map of the subject by assigning initial attenuation values to the geometrical regions of the subject, and to: (i) process emission data acquired from the subject to generate an emission image of the subject, the processing employing the attenuation map of the subject; (ii) update the attenuation map based on corrections calculated using the emission image of the subject; and (iii) iterate operations (i) and (ii) to iteratively generate a reconstructed emission image of the subject.

In accordance with another disclosed aspect, a system is disclosed, comprising: a magnetic resonance (MR) scanner and an MR reconstruction processor configured to cooperatively generate an MR image of a subject; emission radiation detectors configured to acquire emission data of the subject; an MR image segmentation processor configured to identify one or more geometrical regions of the subject using the MR image; and an emission data reconstruction processor configured to perform iterative reconstruction of the emission data to generate an emission image of the subject, the iterative reconstruction utilizing an attenuation map that is iteratively updated with iterations of the iterative reconstruction, at least one iterative attenuation map update being constrained by the geometrical regions of the subject identified by the MR image segmentation processor.

In accordance with another disclosed aspect, a method is disclosed of correcting an emission image for attenuation, the method comprising: segmenting a magnetic resonance (MR) image to form geometrical regions; assigning attenuation values to the geometrical regions; reconstructing emission data based on the attenuation values of the geometrical regions; and correcting the attenuation values of the geometrical regions based on the reconstructed emission data.

One advantage resides in more accurate image reconstruction of PET, SPECT, or other emission data, resulting in quantitative image information as needed for many novel diagnostic applications.

Another advantage resides in synergistic coupling of MR data with PET, SPECT, or other emission data to enhance image reconstruction of the latter.

Further advantages will be apparent to those of ordinary skill in the art upon reading and understand the following detailed description.

FIG. 1 diagrammatically shows a hybrid MR/PET imaging system including a PET reconstruction processor that utilizes an attenuation map having geometry derived from a corresponding MR image and attenuation values derived iteratively from the PET emission data.

Figure 2:
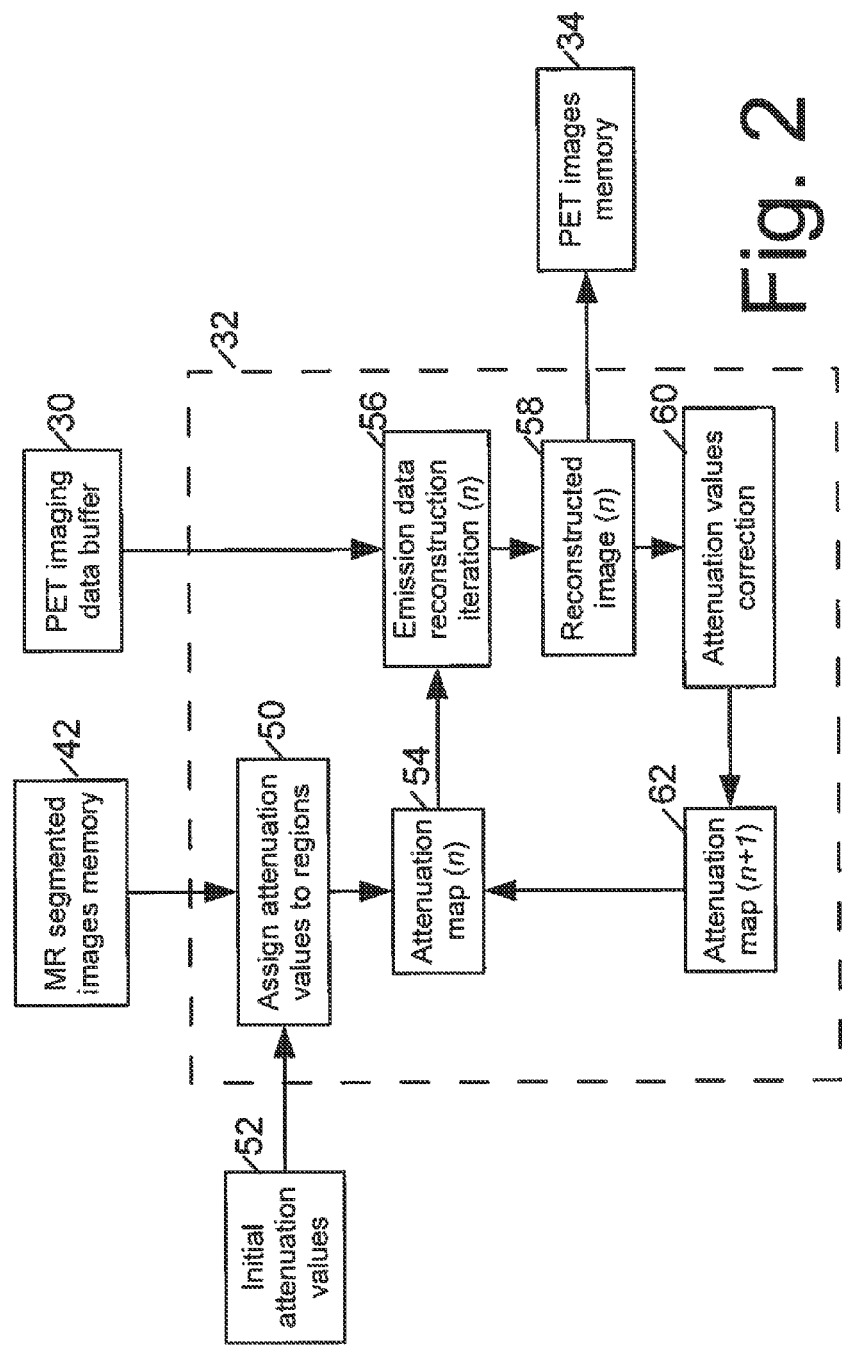

FIG. 2 diagrammatically shows processing performed by the PET reconstruction processor.

With reference to FIG. 1, a hybrid scanner includes a magnetic resonance (MR) scanner 10, which in the illustrated embodiment is a horizontal bore magnetic resonance scanner, and an integrated ring of positron emission tomography (PET) detectors 12. Both the MR scanner 10 and the integrated ring of PET detectors 12 are configured to acquire imaging data from a region of interest 14 disposed in an interior bore of the MR scanner 10. (In diagrammatic FIG. 1, the horizontal bore MR scanner 10 with integral PET detectors 12 is shown with one-half of the MR bore and the corresponding half of the ring of PET detectors 12 cut away to reveal the bore interior and the remaining half of the integrated ring of PET detectors 12). The MR scanner 10 includes components such as a main magnet for generating a static ($B_0$) magnetic field, magnetic field gradient coils for superimposing magnetic field gradients, and one or more radio frequency coils for exciting and detecting magnetic resonance, such components not being shown for simplicity in FIG. 1. The ring of PET detectors 12 includes a backbone 16 of electronics for performing selected "on-board" operations such as optionally performing analog-to-digital conversion of electrical signals caused by radiation detection events, optionally performing digital time stamping of radiation detection events, and so forth. Alternatively, some of these operations may be performed by remote electronics (not shown).

The MR scanner 10 acquires magnetic resonance (MR) data, such as k-space samples, using selected spatial encoding, and the acquired MR data are stored in a MR imaging data buffer 20. An MR reconstruction processor 22 processes the MR data using a reconstruction technique comporting with the selected spatial encoding. For example, if the spatial encoding is a conventional Cartesian encoding employing slice-selective gradients during excitation and phase- and readout-encoding gradients during the magnetic resonance signal decay and readout, respectively, then the MR reconstruction processor 22 suitably employs a Fourier transform-based reconstruction technique. The output of the MR reconstruction processor 22 is a MR image that is stored in an MR images memory 24 and is optionally displayed on a computer 26 or other display device or otherwise utilized.

The PET detectors 12 and associated on-board electronics 16 and/or remote electronics (not shown) detect radiation detection events and perform energy and time windowing to identify substantially simultaneous 511 keV detection events indicative of electron-positron annihilation events. Each pair of substantially simultaneous 511 keV detection events defines a projection or line-of-response that connects the two 511 keV detection events. This set of data, referred to as PET data or more generally as emission data, is stored in a PET imaging data buffer 30.

In some embodiments, the PET detectors 12 have sufficient temporal resolution to resolve time-of-flight time differences (or lack thereof) between the substantially simultaneous detection of two 511 keV gamma particles originating at the same electron-positron annihilation event, and the on-board and/or remote electronics are further configured to localize the electron-positron annihilation event along the line-of-response, thus generating time-of-flight PET data.

The illustrated hybrid scanner 10, 12, 16 is an example. More generally, the techniques disclosed herein for performing emission data reconstruction are suitably practiced in conjunction with any PET scanner, or still more generally in conjunction with any scanner generating emission data, such as the illustrated PET detectors 12, a stand-alone PET detector, a gamma camera generating single-photon emission computed tomography (SPECT) data, or so forth. The techniques disclosed herein for performing emission data reconstruction are further suitably practiced in conjunction with any MR image of the same subject from which the emission data are acquired, such MR image being suitably acquired by the illustrated hybrid scanner 10, 12, 16, or by a stand-alone MR scanner.

With continuing reference to FIG. 1, a PET reconstruction processor 32 employs an iterative reconstruction technique to reconstruct the emission data acquired by the PET system 12, 16 (or more generally, by an radiation emission imaging system such as PET, SPECT, or so forth) to form a reconstructed emission image that is stored in a PET images memory 34 and optionally displayed on the computer 26 or another display device or otherwise utilized.

To perform the emission image reconstruction, the PET reconstruction processor 32 employs an attenuation map that accounts for emission losses caused by re-absorption of emitted radiation within the subject. A suitable attenuation map is generated using a combination of geometrical information provided by the MR image and attenuation value information derived from the emission data set itself.

Toward this end, the MR image is segmented by an MR image segmentation processor 40 to identify one or more geometrical regions of the subject, and this geometrical information is suitably stored in an MR segmented images memory 42. The segmentation processor 40 can employ any suitable segmentation process to delineate anatomically distinct regions of the subject (assuming a human or animal subject having anatomy). Some suitable segmentation processes include, for example: threshold value-based segmentation methods; a Sobel operator-based segmentation method; region growing segmentation methods; watershed segmentation methods; model-based segmentation; or so forth. Optionally, the one or more geometrical regions of the subject identified by the segmentation processor 40 are displayed on the computer 26 for human operator review, and the human operator has the option of using one or more interfacing devices of the computer 26 to adjust or otherwise modify the automatically identified one or more geometrical regions of the subject. The resulting one or more geometrical regions of the subject identified from the MR image by the segmentation processor 40 serve as input to the PET reconstruction processor 32, and the PET reconstruction processor 32 uses the geometrical information about the subject as represented by the identified one or more geometrical regions of the subject in constructing the attenuation map used in the emission data reconstruction.

With continuing reference to FIG. 1 and with further reference to FIG. 2, a suitable reconstruction process employed by the PET reconstruction processor 32 is described. An initial attenuation map generation operation 50 is performed by the PET reconstruction processor 32 to generate an initial attenuation map for use in an initial iteration of an iterative emission data reconstruction process. The initial attenuation map is constructed by assigning initial attenuation values 52 to the one or more geometrical regions of the subject identified by the MR image segmentation. The initial attenuation values 52 can be variously obtained. In one approach, the one or more geometrical regions of the subject define an outer contour of the subject, and initially every voxel or pixel within the contour of the subject is assigned a default attenuation value, for example an attenuation value corresponding to that of water, and assigning a zero attenuation value to voxels or pixels disposed outside of the subject contour (assuming that the ambient is air, which has low absorption for most emission radiation of interest). In such an embodiment, the one or more geometrical regions of the subject may be a single region defining the subject contour, or may be a plurality of geometrical regions collectively defining the subject contour.

In other embodiments, the initial attenuation values 52 comprise a default attenuation value for each geometrical region selected based on a geometry of the geometrical regions. For example, the anatomical identification of some or all of the geometrical regions may be identifiable based on the shape or location of those geometrical regions. In this way, for example, different regions may be labeled as bone regions, fatty regions, muscle regions, or so forth, and a suitable default attenuation value assigned to each such labeled region based on its tissue type.

A combination of these approaches may also be used to select the initial attenuation values 52, for example labeling some geometrical regions based on tissue type and assigning attenuation values based on the tissue type labels, and then assigning a default attenuation value such as the water attenuation value to any region whose tissue type is not determinable based on shape or location of the unidentifiable region.

An initial iteration of an attenuation map 54 is generated by the attenuation values assignment operation 50. The attenuation map 54 is used by an emission data reconstruction iteration 56 performed by the PET reconstruction processor 32 to generate a reconstructed image 58. The emission data reconstruction process performed by the reconstruction processor 32 is iterative. In FIG. 2, the current iteration of the iterative emission data reconstruction process is indexed by the iteration index n, and the attenuation map 54 used in the $n^{th}$ emission data reconstruction iteration 56 is indexed as the $n^{th}$ attenuation map 54, and the reconstructed image 58 output by the $n^{th}$ emission data reconstruction iteration 56 is indexed as the $n^{th}$ reconstructed image 58.

Based on the $n^{th}$ reconstructed image 58, attenuation values corrections are computed in an operation 60, and these corrections are used to generate an updated attenuation map, that is, an $(n+1)^{th}$ attenuation map 62, which is used to perform an $(n+1)^{th}$ iteration of the iterative reconstruction process, and so forth. The iterative processing continues until a stopping criterion is met, such as a similarity measure between successive reconstructed images higher than a threshold value. The reconstructed image generated by the last iteration of the reconstruction process is output to the PET images memory 34 as the final reconstructed PET image. Although not illustrated, it is also contemplated to store, display, or otherwise utilize the last generated attenuation map.

Substantially any iterative reconstruction algorithm suitable for reconstructing emission data can be employed for the iterations 56, such as a maximum likelihood expectation maximization (MLEM) algorithm. The attenuation values correction 60 can also employ any suitable correction algorithm, such as one of those disclosed in Nuyts et al., "Simultaneous Maximum A Posteriori Reconstruction of Attenuation and Activity Distributions from Emission Sinograms", IEEE Trans. on Medical Imaging vol. 18 no. 5, pp. 393-403 (1999), which is incorporated herein by reference in its entirety; or Hawkins et al., U.S. Pat. No. 6,310,968 which is also incorporated herein by reference in its entirety. A suitable approach for the $n^{th}$ emission data reconstruction iteration 56 employing MLEM is as follows:

$$\lambda_j^{(n+1)} = \lambda_j^{(n)} \cdot \frac{\sum_i c_{ij} \cdot \frac{y_i}{b_i}}{\sum_i c_{ij} a_i}, \quad (1)$$

where: n denotes the reconstruction iteration number as already described; j indexes voxels in the region of interest; i indexes pairs of the PET detectors 12 that detect substantially simultaneous 511 keV radiation (in the case of SPECT, the index i suitably indexes single detectors); $\lambda_j$ denotes the estimated activity in the voxel indexed by j; $y_i$ denotes the measured coincident photons in a detector pair indexed by i; $c_{ij}$ denotes a system matrix entry indicative of sensitivity of the detector pair indexed by i toward the voxel indexed by j; and $$a_i = \exp\left(-\sum_k l_{ik} \mu_k\right), \quad (2)$$

and $$b_i = \sum_k c_{ik} \lambda_k, \quad (3)$$

where: $c_{ik}$ denotes the system matrix entry indicative of sensitivity of the detector pair indexed by i toward the voxel indexed by k; $l_{ik}$ denotes an interaction length between a line-of-response of the detector pair indexed by i and the voxel indexed by k; $\lambda_k$ denotes the estimated activity in the voxel indexed by k; and $\mu_k$ denotes the attenuation coefficient of the voxel indexed by k, which for the $n^{th}$ iteration is provided by the $n^{th}$ attenuation map 54. For time-of-flight PET data, Equation (1) suitably incorporates time-of-flight localization of the electron-positron annihilation events as follows:

$$\lambda_j^{(n+1)} = \lambda_j^{(n)} \cdot \frac{\sum_i c_{ij} \cdot \frac{y_i}{b_i} \cdot \eta_{ToF_{ij}}}{\sum_i c_{ij} a_i \eta_{ToF_{ij}}}, \quad (4)$$

where $\eta_{ToF_{ij}}$ denotes the average weighting factor towards time-of-flight information depending upon the detector pair indexed by i and the voxel indexed by j.

A suitable approach for performing the attenuation values correction 60 is to forward project the updated activity image to generate projection data or lines-of-response $y_i$ for the detector pairs i, and to compute a correction field $K_j$ according to:

$$K_j = \frac{\alpha_p}{N} \cdot \left(1 - \frac{\sum_i c_{ij} y_i}{\sum_i c_{ij} a_i b_i}\right), \quad (5)$$

where: N denotes a diameter of the reconstruction volume; and $\alpha_p$ denotes a relaxation factor. The correction field $K_j$ is used to update the attenuation map according to:

$$\tilde{\mu}_r^{(n+1)} = \tilde{\mu}_r^{(n)} + \frac{\sum_{j \in R_r} K_j}{\sum_{j \in R_r} 1}, \quad (6)$$

where: $R_r$ denotes a geometrical region indexed by r where the index r runs over the regions identified by the MR image segmentation stored in the memory 42; $\tilde{\mu}_r^{(n)}$ denotes the region-specific attenuation coefficient for the $n^{th}$ attenuation map 54; $\tilde{\mu}_r^{(n+1)}$ denotes the region-specific attenuation coefficient for the $(n+1)^{th}$ attenuation map 62; and the fractional term in Equation (6) represents the average attenuation value correction for the region $R_r$.

The attenuation map update of Equation (6) operates on a per-geometrical region basis, with each geometrical region $R_r$ assigned a single updated attenuation value $\tilde{\mu}_r^{(n+1)}$ for all pixels or voxels of the region. The attenuation map update of Equation (6) assigns a generally different attenuation value to each of the geometrical regions. By "generally different" it is meant that the attenuation map update assigns an attenuation value to each region, which is typically different from the attenuation values assigned to other regions but which may in some instances be the same as an attenuation value assigned to another region or regions. For example, if two different regions correspond to a common tissue type (for example, both representing bone regions) it is likely that the attenuation map update may assign the same or similar attenuation values to these two different regions corresponding to the same tissue type.

In an alternative approach, the attenuation map update can be performed on a per-pixel or per-voxel basis, by updating each pixel or voxel j of the attenuation map according to $\mu_j^{(n+1)} = \mu_j^{(n)} + K_j$.

Another contemplated variation is to perform a per-region attenuation map update in accordance with Equation (6) for the first few iterations, and then to switch over to a per-pixel or per-voxel attenuation map update in accordance with $\mu_j^{(n+1)} = \mu_j^{(n)} + K_j$ for subsequent iterations. This approach allows initial convergence to an attenuation map that is optimized with respect to the regions, which entails optimizing relatively few parameters and should give a good approximation to the actual subject attenuation; then to follow up with the more computationally intensive per-pixel or per-voxel optimization starting from the (close to correct) attenuation map optimized with respect to the regions. The timing of the switch from per-region attenuation map updating to per-pixel or per-voxel attenuation map updating can be based on various criteria. In a simple approach, per-region attenuation map updating is used for a fixed number of first iterations, for example for the first three iterations, and per-pixel or per-voxel updating is then used for the remaining iterations, for example the fourth and later iterations. In a more complex approach, a switch criterion can be monitored, such as calculating the maximum change in the attenuation value of any region from one iteration to the next. When this maximum change falls below a threshold, thus indicating that the per-region attenuation map optimization is close to convergence, the switch is made to per-pixel or per-voxel updating.

In yet another contemplated variation, a per-region attenuation value update can be performed for pixels or voxels in regions believed to have substantially uniform absorption, while a per-pixel or per-voxel attenuation value update can be performed for pixels or voxels in regions that are expected to have more non-uniform absorption. The assignment of a region as uniform or non-uniform can be based on a priori knowledge of the likely tissue type or organ identity of the region, or can be based on quantitative measures such as the variation of the correction field $K_j$ across the region. In the latter approach, for example, any region for which the correction field $K_j$ varies by more than a threshold amount is updated on a per-pixel or per-voxel basis, under the assumption that the large variation in the correction field $K_j$ across the region indicates that the region has non-uniform absorption.

Still further, updates other than those of Equations (5) and (6) or the update $\mu_j^{(n+1)} = \mu_j^{(n)} + K_j$ can be used. For example, in some embodiments the values $\tilde{\mu}_j^{(n+1)}$ or $\mu_j^{(n+1)}$ are calculated as described herein, but the attenuation values assigned to the regions or voxels or pixels of the attenuation map are selected from a group of standard values based on the calculated $\tilde{\mu}_j^{(n+1)}$ or $\mu_j^{(n+1)}$ values. For instance, the standard values may include $\tilde{\mu}_{air}=0$, $\tilde{\mu}_{bone}$, $\tilde{\mu}_{fat}$, $\tilde{\mu}_{tissue}$, $\tilde{\mu}_{blood}$, for air, bone, fat, tissue, and blood, respectively. Then for each region or voxel or pixel to be updated, the attenuation value assigned is whichever of the standard values $\tilde{\mu}_{air}=0$, $\tilde{\mu}_{bone}$, $\tilde{\mu}_{fat}$, $\tilde{\mu}_{tissue}$, $\tilde{\mu}_{blood}$ is closest the calculated value $\mu_j^{(n+1)}$ or $\mu_j^{(n+1)}$.

In the foregoing, it is assumed that the MR image and the emission data employ the same subject coordinates system. This is likely to be the case for the illustrated hybrid scanner 10, 12, 16. When the MR image and the emission data are acquired by respective separate or stand-alone imaging systems, correspondence of the MR and emission coordinate systems can be achieved using fiducial markers disposed on the subject and visible in both the MR and emission systems. Alternatively, the PET data are optionally initially "coarse" reconstructed without accounting for absorption and the resulting "coarse" image is spatially aligned or registered with the MR image to determine a common subject coordinates system for the MR image and the emission data. The iterative emission data reconstruction algorithm disclosed with reference to FIG. 2 can then be applied to the spatially registered MR image and emission data.

In some contemplated embodiments, the iterative updating of the attenuation map also includes adjusting the size and/or shape of the geometrical regions. In one suitable approach, shape models are defined for at least one of the geometrical regions, for example using polygon- or spline-based surface models. The shape model can be fitted to the relevant segment of the segmented MR image to define initial shape model parameters. Thereafter, when the attenuation map is updated in each iteration the attenuation values correction 60 is used to update the shape model. For example, the correction field $K_j$ can be expected to be large at boundaries where the current surface model does not conform with the region shape as represented in the emission data. The shape model can then be iteratively adjusted according to information from the iteratively generated correction field $K_j$. Such geometry correction is advantageous if, for example, to accommodate changes in the patient between the MR and the PET data acquisitions. Such changes are known to be relatively frequent in the abdominal region and in some other regions of a human subject. The correction field $K_j$ can be used, for example, to adapt the shape of the region representing the stomach, the belly outer contour, or so forth to accommodate typical changes that may occur between data acquisitions.

The various computational components 22, 32, 40 disclosed herein can be implemented in various ways, for example by a computer or other device including a digital processor and programmed or including firmware to perform the disclosed processing, or by hybrid or analog circuitry configured to perform the disclosed processing or portions thereof, or so forth. In some embodiments the computational components 22, 32, 40 may be embodied by the illustrated computer 26 having suitable firmware or programming. The MR and emission data and image processing methods disclosed herein can be implemented by such a processor or other hardware, and/or can be embodied as a storage medium storing instructions that when executed by such a processor or other hardware perform the disclosed methods. Such a storage medium may be embodied by one or more types of storage media, such as one or more of: a magnetic disk; an optical disk; a FLASH memory or other electrostatic memory; a random access memory (RAM); a read-only memory (ROM); or so forth.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method operating in conjunction with a magnetic resonance (MR) image of a subject and emission data acquired from the subject, the method comprising:
    identifying one or more geometrical regions of the subject using the MR image; and
    iteratively reconstructing the emission data to generate an emission image of the subject utilizing an attenuation map defined by the geometrical regions with attenuation values for the geometrical regions approximated based on the iterative reconstruction including iteratively updating the attenuation values for the geometrical regions after each iteration of the iterative reconstruction based on attenuation information derived from an updated emission image generated by the most recent iteration of the iterative reconstruction.

2. The method as set forth in claim 1, further comprising: displaying the emission image.

3. The method as set forth in claim 1, further comprising: acquiring the emission data from the subject using one of positron emission tomography (PET) and single photon emission computed tomography (SPECT).

4. The method as set forth in claim 1, further comprising: initiating the iterative reconstruction by generating initial attenuation values for the geometrical regions, the initial attenuation values being one of:
    (i) a same attenuation value for all geometrical regions, and
    (ii) a default attenuation value for each geometrical region selected based on at least one of shape, position, and size of the geometrical regions.

5. The method as set forth in claim 1, wherein the iterative updating of the attenuation values for the geometrical regions comprises:
    updating attenuation values on a per-pixel or per-voxel basis for at least some iterations of the iterative reconstruction.

6. The method as set forth in claim 1, wherein the iterative updating of the attenuation values for the geometrical regions comprises:
    updating attenuation values on a per-region basis for at least some iterations of the iterative reconstruction by assigning the same attenuation value to all pixels or voxels of a given region.

7. The method as set forth in claim 1, wherein the updating of the attenuation values comprises:
    forward projecting the updated emission image generated by the most recent iteration of the iterative reconstruction to generate forward projection data; and
    calculating attenuation value corrections based on comparison of the forward projection data and the emission data acquired from the subject.

8. The method as set forth in claim 1, wherein the subject is an animal or human subject, and the identifying geometrical regions of the subject using the MR image comprises:
    segmenting the MR image to identify a plurality of anatomically distinct regions.

9. The method as set forth in claim 1, wherein the subject is an animal or human subject, and the identifying one or more geometrical regions of the subject using the MR image comprises:
    identifying a single region comprising an outer contour of the subject in the MR image.

10. The method as set forth in claim 1, wherein in the iterative reconstruction a geometry of at least one of the geometrical regions is represented by a shape model that is updated based on the iterative reconstruction.

11. An apparatus comprising:
    a reconstruction processor configured to identify one or more geometrical regions of a subject using an MR image of the subject, generate an attenuation map of the subject by assigning initial attenuation values to the geometrical regions of the subject, and to:
    (i) process emission data acquired from the subject to generate an emission image of the subject, the processing employing the attenuation map of the subject,
    (ii) update the attenuation map based on corrections calculated using the emission image of the subject, and
    (iii) iterate operations (i) and (ii) to iteratively generate a reconstructed emission image of the subject.

12. The apparatus as set forth in claim 11, further comprising:
    a display configured to display the reconstructed emission image of the subject.

13. The apparatus as set forth in claim 11, wherein the update operation (ii) comprises:
    (ii)(a) forward projecting the emission image of the subject to generate forward projection data, and
    (ii)(b) calculating a correction of the attenuation map based on comparison of the forward projection data and the emission data acquired from the subject.

14. The apparatus as set forth in claim 11, further comprising:
    a MR scanner configured to generate the MR image of the subject; and
    single photon emission computed tomography (SPECT) or positron emission tomography (PET) detectors configured to acquire the emission data acquired from the subject.

15. The apparatus as set forth in claim 11, wherein the reconstruction processor comprises an MR image segmentation processor configured to segment the MR image of the subject to identify the one or more geometrical regions of the subject.

16. The apparatus as set forth in claim 11, wherein the reconstruction processor is configured to identify a plurality of geometrical regions of the subject using the MR image of the subject, and the attenuation map update operation (ii) assigns a generally different attenuation value to each of the geometrical regions.

17. The apparatus as set forth in claim 11, wherein the attenuation map update operation (ii) assigns a generally different attenuation value to each pixel or voxel of the attenuation map.

18. The apparatus as set forth in claim 11, wherein the reconstruction processor is configured to identify a plurality of geometrical regions of the subject using the MR image of the subject, and the attenuation map update operation (ii) assigns:
   attenuation values on a per-geometrical region basis for a first one or more of the iterations (iii) and
   attenuation values on a per-pixel or per-voxel basis for a subsequent one or more of the iterations (iii).

19. A method of correcting an emission image for attenuation, the method comprising:
   segmenting a magnetic resonance (MR) image to form geometrical regions;
   assigning attenuation values to the geometrical regions;
   reconstructing emission data based on the attenuation values of the geometrical regions; and
   correcting the attenuation values of the geometrical regions based on the reconstructed emission data.

20. The method as set forth in claim 19, wherein the correcting comprises:
   forward projecting the reconstructed emission data to generate forward projection data; and
   correcting the attenuation values of the geometrical regions based on comparison of the forward projection data and the emission data.

21. A non-transitory storage medium storing instructions executable by a digital processor to perform a method operating in conjunction with a magnetic resonance (MR) image of a subject and emission data acquired from the subject, the method comprising:
   identifying one or more geometrical regions of the subject using the MR image;
   iteratively reconstructing the emission data to generate an emission image of the subject utilizing an attenuation map defined by the geometrical regions; and
   updating attenuation values for the geometrical regions after each iteration of the iterative reconstruction based on attenuation information derived from an updated emission image generated by the most recent iteration of the iterative reconstruction.

22. An apparatus comprising:
   a non-transitory storage medium as set forth in claim 21; and
   an emission data reconstruction processor comprising a digital processor operatively connected with the non-transitory storage medium to execute the instructions stored on the non-transitory storage medium.

23. The non-transitory storage medium as set forth in claim 21, wherein the updating of the attenuation values comprises:
   forward projecting the updated emission image generated by the most recent iteration of the iterative reconstruction to generate forward projection data; and
   calculating attenuation value corrections based on comparison of the forward projection data and the emission data acquired from the subject.

* * * * *